(12) United States Patent
Inoue

(10) Patent No.: US 12,538,387 B2
(45) Date of Patent: Jan. 27, 2026

(54) HEATING LIGHT SOURCE DEVICE

(71) Applicant: Ushio Denki Kabushiki Kaisha, Tokyo (JP)

(72) Inventor: Takahiro Inoue, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 972 days.

(21) Appl. No.: 17/687,560

(22) Filed: Mar. 4, 2022

(65) Prior Publication Data

US 2022/0369423 A1 Nov. 17, 2022

(30) Foreign Application Priority Data

May 7, 2021 (JP) ................. 2021-078946

(51) Int. Cl.
*H05B 3/00* (2006.01)
*H05K 7/20* (2006.01)
(52) U.S. Cl.
CPC ....... *H05B 3/0047* (2013.01); *H05K 7/20272* (2013.01); *H05B 2203/032* (2013.01)
(58) Field of Classification Search
CPC ............ H05B 2203/032; H05B 3/0047; H05K 7/20272; H01L 21/67098; H01L 21/67115
USPC ....................................... 392/407
See application file for complete search history.

(56) References Cited

U.S. PATENT DOCUMENTS

| 2009/0039380 A1 | 2/2009 | Inui et al. |
| 2011/0033175 A1 | 2/2011 | Kasai et al. |
| 2011/0174790 A1* | 7/2011 | Suzuki ............. H01L 21/67115 219/121.84 |
| 2012/0145355 A1* | 6/2012 | Schreir-Alt ............... F28F 3/12 165/104.19 |
| 2021/0398830 A1* | 12/2021 | Sugimoto ............. H01L 21/324 |
| 2022/0201896 A1* | 6/2022 | Edmunds ........... H05K 7/20254 |

FOREIGN PATENT DOCUMENTS

| JP | 2009-065127 A | 3/2009 |
| JP | 2009-295953 A | 12/2009 |
| JP | 6558222 B2 | 5/2017 |

(Continued)

OTHER PUBLICATIONS

Japanese Office Action with English Translation, drafted on Aug. 27, 2024 to Japanese Patent Application No. 2021-078946, which corresponds to the current U.S. Appl. No. 17/687,560.

(Continued)

*Primary Examiner* — Sang Y Paik
(74) *Attorney, Agent, or Firm* — Yoshida & Associates LLC; Kenichiro Yoshida

(57) ABSTRACT

A heating light source device includes a light source section having a plurality of light-emitting element areas that contain a plurality of light-emitting elements, each of the light-emitting element areas being separated from each other; a cooling unit disposed in contact with the light source section; a plurality of cooling channels formed inside the cooling unit and disposed independently each other; a first main channel connected with one end of each of the cooling channels; and a second main channel connected with the other end of each of the cooling channels, and each of the cooling channels is formed at an internal position of the cooling unit corresponding to the light-emitting element areas.

8 Claims, 7 Drawing Sheets

(56) References Cited

FOREIGN PATENT DOCUMENTS

TW          2008-22230  A      5/2008
TW          2017-34606  A     10/2017

OTHER PUBLICATIONS

Taiwanese Office Action with English Translation, drafted on Aug. 27, 2024 to Taiwanese Patent Application No. 111106299, which corresponds to the current U.S. Appl. No. 17/687,560.

* cited by examiner

HEATING LIGHT SOURCE DEVICE

TECHNICAL FIELD

The present invention relates to light source devices, and more particularly relates to a heating light source device for heating an object to be irradiated using optical irradiation.

BACKGROUND ART

Semiconductor manufacturing process involves various types of heat treatments including a deposition treatment, an oxidation diffusion treatment, a modification treatment, and an annealing treatment on workpieces, such as semiconductor wafers. The treatments often adopt a method of heat treatment using optical irradiation, which enables a non-contact process.

The characteristics of LED elements fluctuate with temperature even when the current supplied to the LED elements is constant; their brightness is lower at higher temperatures. Hence, many devices in which LED elements are used as heating light sources are provided with heat sinks for air cooling or channels for water cooling that are to be in contact with the substrate on which the LED elements are mounted (light-emitting element substrate), allowing the LED elements to maintain their desired brightness.

In particular, optical irradiation devices, for heat treatment of semiconductor wafers, which uses a large number of LED elements to satisfy high output requirement, generally adopt a water-cooled cooling mechanism, which has higher heat exhausting performance than an air-cooled one. For example, the following Patent Document 1 discloses an annealing device in which LED elements are used as a heating light source, and a cooling mechanism configured to cool the LED elements by passing a cooling medium through channels.

Patent Document 1: JP-A-2009-295953

For example, devices that irradiate semiconductor wafers with light, which are used in the semiconductor manufacturing process, are expected to irradiate the entire surface (especially the main surface) of the workpiece with light having the same intensity to enable the uniform treatment on the entire semiconductor wafer. Even in the case of performing heat treatment on workpieces other than semiconductor wafers (for example, glass substrates), irradiating the entire surface of the workpiece with uniform light is expected because uneven heating is undesirable.

With the above-described in mind, the present inventor has intensively studied an optical irradiation device that can irradiate the entire workpiece, such as a semiconductor wafer, with more uniform light, and has found that the following problems exist.

The annealing device described in above-mentioned Patent Document 1 is composed of a heating source of LED elements arranged across a wider area than the workpiece, and a cooling medium for cooling the LED elements, the cooling medium being supplied from a supply pipe to channels, flowing through the channels, and being discharged to a discharge pipe.

The annealing device is equipped with two heating sources so that their heating light can be irradiated onto both front and back main surfaces of the workpiece, and each of the heating sources is provided with a cooling mechanism. Each cooling mechanism is configured that a cooling medium that is supplied from one supply pipe to one channel and is discharged to one discharge pipe.

The cooling medium that flows through the channel while absorbing the heat generated by the LED elements becomes warmer toward the downstream due to the absorbed heat. Hence, the heat generated by LED elements located in the downstream area of the channel through which the cooling medium flows is less likely to be absorbed by the cooling medium than the heat generated by LED elements located in the upstream area of the channel.

In other words, in a cooling mechanism that is simply composed of a channel through which the cooling medium flows, there arises a significant temperature difference between the temperature of the LED elements located in the upstream area of the channel through which the cooling medium flows and the temperature of the LED elements located in the downstream area of the channel therethrough. As a result, each LED element suffers an uneven brightness depending on the area in which it is located, resulting in uneven irradiation onto the irradiated surface of the workpiece.

In addition, when semiconductor light-emitting elements such as LED elements are maintained in a high-temperature state for a long time due to insufficient cooling, they tend to degrade faster and have a shorter service life than elements that are sufficiently cooled. In other words, the annealing device with the above configuration gradually exhibits the uneven irradiation and uneven heating since each LED element degrades differently while in use.

When the uneven irradiation or uneven heating occurs to an unacceptable level, the entire LED elements may be considered to be replaced; however, such a measure includes the replacement of LED elements that have not yet degraded much, thus increasing the cost for maintaining the device.

SUMMARY OF INVENTION

With the consideration of the above issues, it is an object of the present invention to provide a heating light source device that suppresses uneven irradiation of light that is irradiated from light-emitting elements onto a workpiece.

A heating light source device according to the present invention includes a light source section having a plurality of light-emitting element areas that contain a plurality of light-emitting elements, each of the light-emitting element areas being separated from each other;
  a cooling unit disposed in contact with the light source section, the cooling unit having a main surface on which the light source section is mounted;
  a plurality of cooling channels formed inside the cooling unit and each of the cooling channels independently disposed each other;
  a first main channel connected with one end of each of the cooling channels; and
  a second main channel connected with the other end of each of the cooling channels,
  wherein each of the cooling channels is formed at an internal position of the cooling unit corresponding to the light-emitting element areas.

The term "light-emitting element area" in the present specification refers to an area in which a plurality of light-emitting elements are closely arranged, and specifically, the area surrounded by a line connecting the outer edges of a group of light-emitting elements arranged with a pitch of 2 mm or less. The "pitch of light-emitting elements" in the present specification means a distance between the centers of light-emitting elements.

In addition, in the present specification, the term "the cooling channel is formed at an internal position of the cooling unit corresponding to the light-emitting element area" means that the cooling channel is formed inside the cooling unit to make it possible to distinguish which light-emitting element area is to be cooled. Note that the number of the cooling channels for cooling one light-emitting element area need not necessarily to be one, but can be a multiple number.

Also, the term "the cooling unit disposed in contact with the light source part" in the present specification includes the case in which the cooling unit is disposed to be directly in contact with the light source section, as well as the case in which the cooling unit is disposed to be thermally in contact with the light source section via grease or other materials to enhance thermal conductivity. The light source section is typically composed of a plurality of the light-emitting elements arranged on the light-emitting element substrate; however, the light source section may be further provided with, for example, a highly thermal conductive sheet on the surface of the light-emitting element substrate opposite to the surface on which the light-emitting elements are arranged.

The cooling channel is a channel formed inside the cooling unit for flowing through a cooling medium. The cooling medium is introduced from the first main channel into a plurality of the cooling channels that are formed in the respective cooling units. Then, the cooling medium flowing through the respective cooling channels flows into the second main channel, discharging outside the light source device. In other words, a plurality of the cooling channels that have been formed inside the cooling units are connected in parallel between the first main channel and the second main channel.

The above configuration allows the cooling medium to be supplied to each of the cooling channels that correspond to the respective light-emitting element areas, in a state in which heat has hardly been absorbed since the cooling medium is supplied directly from the first main channel to each of the cooling channels that correspond to the respective light-emitting element areas. Hence, no cooling medium being in a state in which heat has been absorbed from a light-emitting element area is supplied to a cooling channel to absorb the heat from another light-emitting element area, thereby suppressing the temperature variation among the respective light-emitting element areas.

Since the temperature variation among the respective light-emitting element areas is suppressed, the variation in brightness of the light-emitting elements is suppressed, therefore suppressing the uneven irradiation of the heating light onto a workpiece.

The light source section may be provided with a single light-emitting element substrate or a plurality of light-emitting element substrates. In the latter case, the respective light-emitting element substrates may be spaced apart in a direction parallel to the plane of the substrate, and the area containing a plurality of the light-emitting elements mounted on each light-emitting element substrate may form a different light-emitting element area.

In the above heating light source device, the light source section may include a plurality of light-emitting element substrates that are divided by each of the light-emitting element areas, each light-emitting element substrate having a mounting surface on which the light-emitting elements are mounted and each light-emitting element substrate may be configured to overlap with at least part of the cooling channel when viewed from a direction orthogonal to the mounting surface of the light-emitting element substrate.

The above configuration makes it difficult for the heat generated at each light-emitting element area to diffuse in a direction parallel to the mounting surface of the light-emitting element substrate, suppressing each cooling channel from absorbing the heat generated in a light-emitting element area to which the cooling channel does not correspond. Hence, each cooling channel mainly absorb the heat generated in its corresponding light-emitting element area for cooling, suppressing a part of light-emitting element areas from being cooled insufficiently.

In the above heating light source device, the cooling channel may have a spiral shape being gradually from a center portion side of the light-emitting element area to the circumferential edge portion side thereof when viewed from a direction orthogonal to the main surface of the cooling unit.

The cooling medium flowing through the cooling channel absorbs heat generated by the light-emitting elements and propagated through the cooling unit by exchanging the heat with the inner wall face of the cooling channel. Hence, in order to cool the light-emitting element substrate more efficiently, it is necessary to increase the surface area of the entire inner wall face of the cooling channel so that more heat can be exchanged between the cooling medium and the inner wall face of the cooling channel.

In addition, the light-emitting element substrate tends to become hotter at the center portion side, where the heat generated by the light-emitting elements is less likely to be dissipated, than at the circumferential edge portion side. Hence, the cooling channel is preferably formed in such a way that the cooling medium gradually flows through from the center portion side of the light-emitting element area toward the circumferential edge portion side thereof, so that the cooling medium can absorb more heat at the center portion side of the light-emitting element area.

The above configuration allows the surface area of the entire inner wall face of the cooling channel to be increased compared with the case in which a cooling channel is formed to flow in only one direction, and enables the center portion side of the light-emitting element area to be effectively cooled, thereby averaging the temperature distribution over the entire light-emitting element area.

In the above heating light source device, the cooling channel may have a channel width that is configured to satisfy the following formula (1) when viewed from a direction orthogonal to the main surface of the cooling unit:

$$1 \text{ mm} \leq w \leq c + 2d \qquad (1)$$

where w is the channel width, c is an average length of sides of the light-emitting elements, each of the one sides being defined as equal to or longer than the other side thereof; and d is a separation distance between the main surface of the cooling unit and the cooling channel with respect to the direction orthogonal to the main surface of the cooling unit.

In addition, in the case that the cooling channel has a spiral shape being gradually from a center portion side of the light-emitting element area to the circumferential edge portion side thereof when viewed from a direction orthogonal to the main surface of the cooling unit, the cooling channel is preferably formed along the arrangement pattern of the light-emitting elements to cool each of the light-emitting elements located in the light-emitting element area.

In the cooling unit, even when the cooling channel is configured to have a large channel surface area, if the cooling channel is located too far from the light-emitting elements, the cooling unit will have a larger thermal resistance, decreasing the cooling performance. Hence, the surface area of the cooling channel, especially the channel width w of the cooling channel, is preferably determined in consideration of the separation distance d between the cooling channel and the light-emitting elements.

The width to which the heat generated by the light-emitting elements diffuses inside the cooling member when the heat reaches the cooling channel will be described in the "DESCRIPTION OF EMBODIMENTS" with reference to FIG. 5b; the width is c+2d, when the heat is assumed to be isotropically diffused inside the cooling member. Hence, the channel width of the cooling channel is preferably c+2d or less in order to average the temperature distribution in the light-emitting element area. Also, the cooling channel is particularly preferably formed directly under the light-emitting elements to improve the cooling performance.

However, forming a cooling unit having a very narrow cooling channel with a width of less than 1 mm requires processing equipment and processing technology capable of high precision processing, increasing the manufacturing cost. Hence, in order to reduce the manufacturing cost and to achieve efficient cooling, the width w of the cooling channel is preferably within the range shown in the above formula (1).

The result, which is just a theoretical calculation under the given condition that mimics the actual example, shows that the temperature difference between the inner wall face of the cooling channel and the cooling medium (hereinafter referred to as the "wall face temperature difference") is small when the channel width is in the range of 1 mm to 5 mm. This result also concludes that the channel width of the cooling channel is preferably 1 mm or more, which is unlikely to cause a rapid degradation in exhaust heat efficiency in response to variation in the channel width. The detail will be described in the "DESCRIPTION OF EMBODIMENTS" with reference to FIG. 6.

The condition for the channel width of the above cooling channel mainly needs to be satisfied in the area in which the cooling medium exchanges heat with the inner wall face of the cooling unit; and it does not necessarily need to be satisfied in the entire cooling channel.

In the above heating light source device, the cooling unit may be divided into a plurality of cooling members when viewed from a direction orthogonal to the main surface of the cooling unit, and each of the cooling members may have the cooling channel formed thereinside.

The present invention provides a heating light source device that suppresses the uneven irradiation of the light irradiated from the light-emitting elements onto the workpiece.

DESCRIPTION OF EMBODIMENTS

Hereinafter, embodiments of a heating light source device according to the present invention will now be described with reference to the drawings. It is noted that each of the following drawings related to the heating light source device is merely schematically illustrated. The dimensional ratios and the number of parts on the drawings do not necessarily match the actual dimensional ratios and the actual number of parts.

Figure 1A:
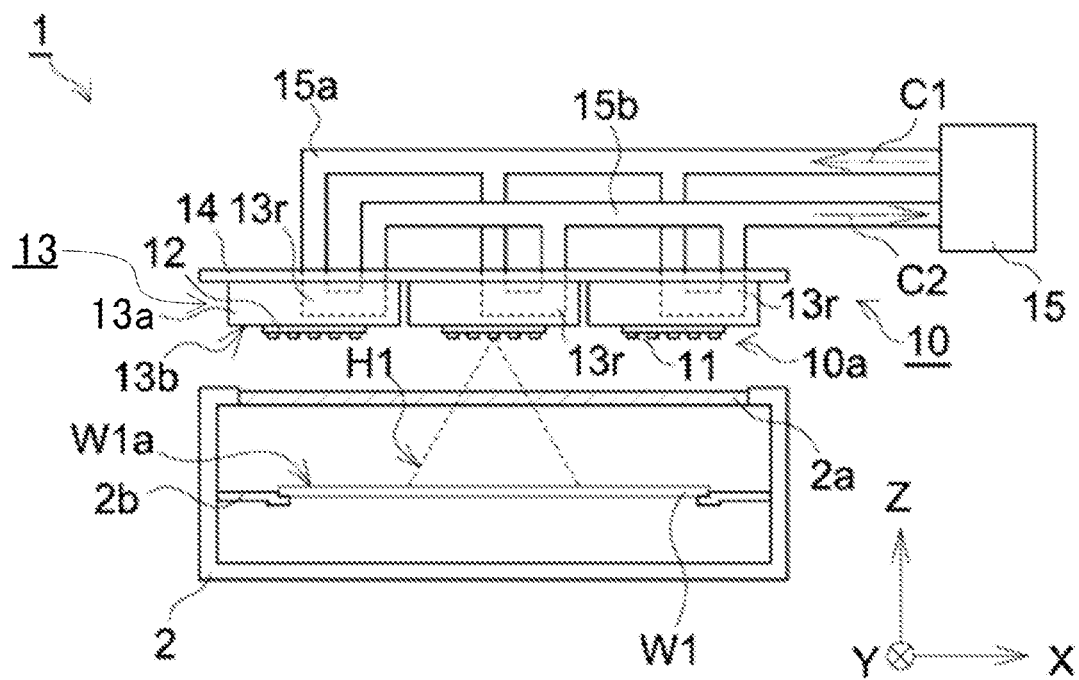
FIG. 1A is a schematic cross-sectional view illustrating an optical heating system provided with a heating light source device of an embodiment when viewed in the Y direction.
Figure 1B:
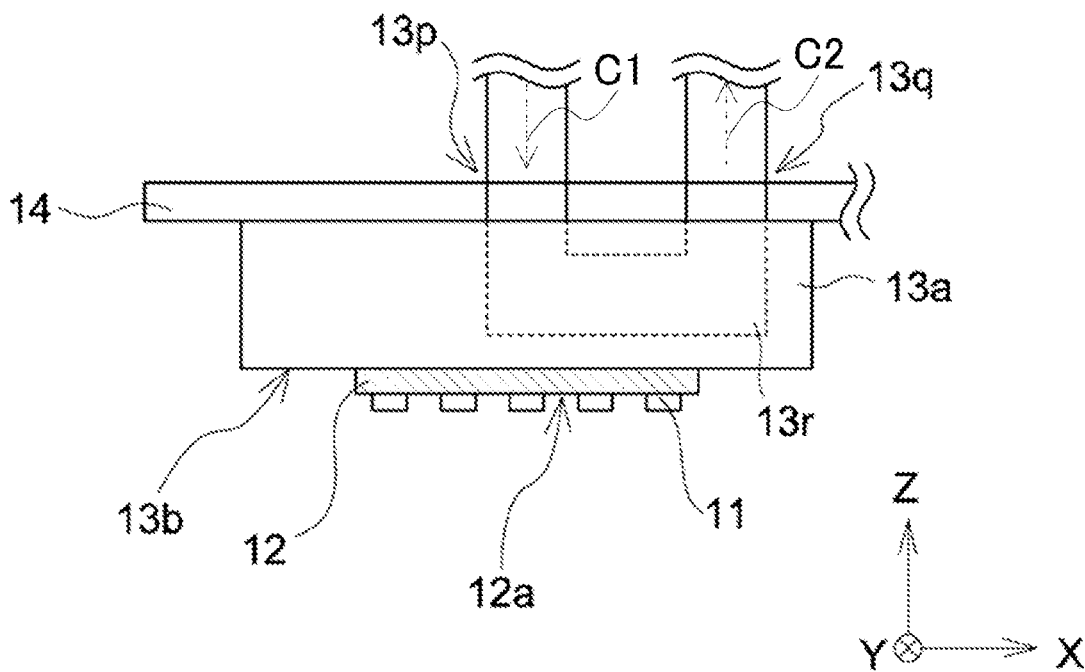
FIG. 1B is an enlarged view in the vicinity of a cooling member in FIG. 1A.

FIG. 1A is a schematic cross-sectional view illustrating an optical heating system 1 provided with a heating light source device 10 of an embodiment when viewed in the Y direction. FIG. 1B is an enlarged view in the vicinity of a cooling member in FIG. 1A. As shown in FIG. 1A, the optical heating system 1 includes a heating light source device 10 and a chamber 2 in which a workpiece W1 is accommodated. The heating light source device 10 of the present embodiment includes a plurality of light-emitting elements 11, a plurality of light-emitting element substrates 12, a cooling unit 13 divided into a plurality of cooling members 13a, a base 14, a first main channel 15a, and a second main channel 15b, as shown in FIG. 1A.

The light-emitting element substrate 12 is a substrate on which a plurality of the light-emitting elements 11 are arranged. In the present embodiment, the heating light source device 10 includes a plurality of the light-emitting element substrates 12, each light-emitting element substrate 12 has a plurality of the light-emitting elements 11 thereon and constitutes a light source section 10a as a whole. In the present embodiment, the cooling unit 13 is a member that cools the light-emitting element substrate 12 and is configured to communicate a cooling medium C1 thereinside. The first main channel 15a is a channel that introduces the cooling medium C1 into the cooling unit 13, and the second main channel 15b is a channel that discharges the cooling medium C2 having flowed through inside the cooling unit 13 from the cooling unit 13. The base 14 is a base that fixes the cooling unit 13; however, the base 14 may not be provided in the heating light source device 10.

Figure 2:
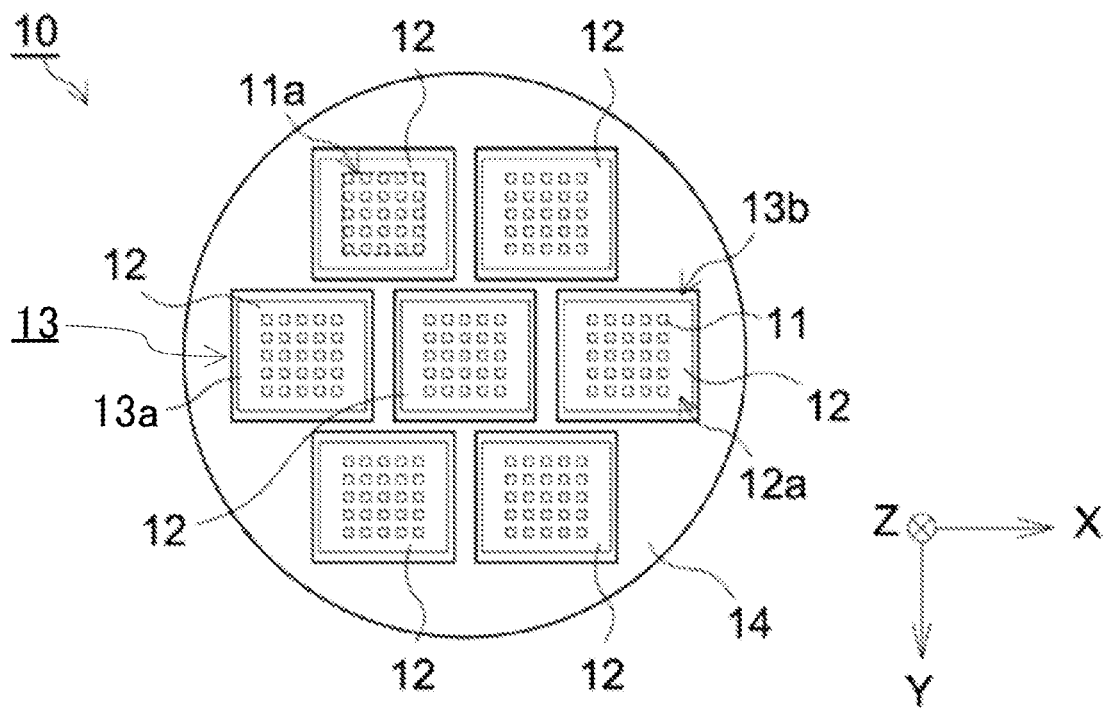
FIG. 2 is a drawing of the heating light source device in FIG. 1A when viewed from the −Z side.
Figure 3:
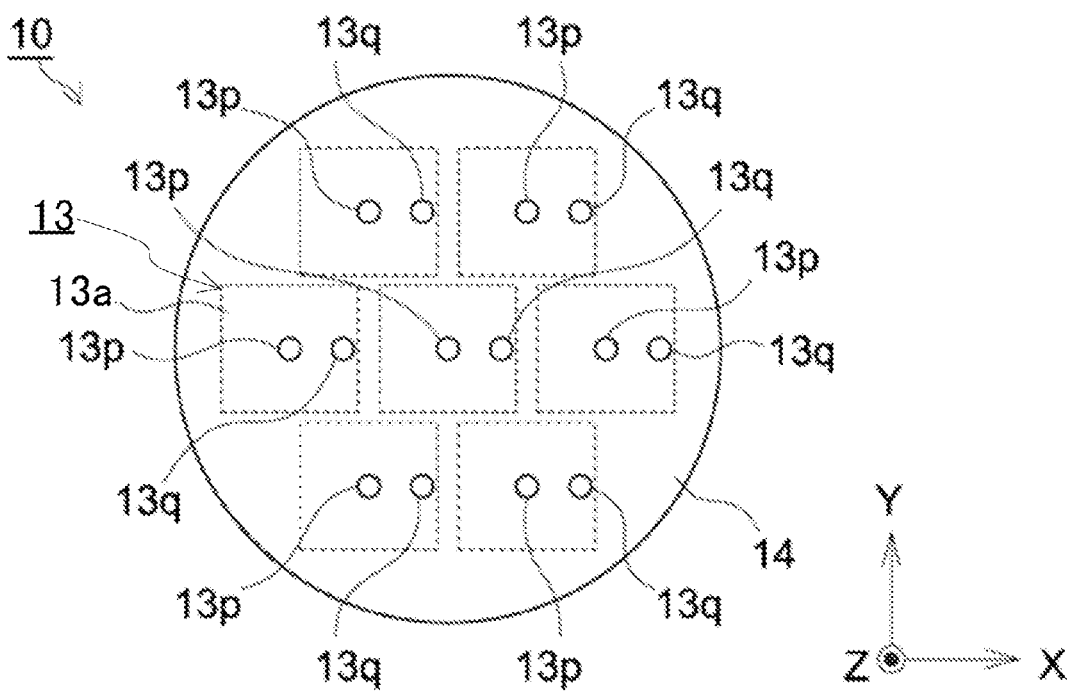
FIG. 3 is a drawing of the heating light source device in FIG. 1A when viewed from the +Z side.

FIG. 2 is a drawing of the heating light source device 10 in FIG. 1A when viewed from the −Z side. FIG. 3 is a drawing of the heating light source device 10 in FIG. 1A when viewed from the +Z side. For the convenience of explanation, in FIG. 3, the first main channel 15a and the second main channel 15b are not illustrated; and the cooling members 13a mounted on the +Z side of the base 14, which are actually invisible, are illustrated with dashed lines.

Hereinafter, a plane parallel to the mounting surface 12a of the light-emitting element substrate 12 is denoted as the XY plane, and a direction orthogonal to the XY plane is denoted as the Z direction as shown in FIG. 2. It is noted that one direction along which the light-emitting elements 11 are arranged is described as the X direction and the other direction is described as the Y direction; however, there is no particular distinction between the X and Y directions in the present embodiment.

Moreover, in the case of expressing a direction that distinguishes a positive direction from a negative direction, a positive or negative sign is assigned to the direction, such as "+Z direction" or "−Z direction". In the case of expressing a direction without distinguishing a positive direction from a negative direction, the direction is simply expressed as "Z direction".

As shown in FIG. 1A, the chamber 2 is provided with a light-transmissive window 2a to allow heating light H1 emitted from the heating light source device 10 to enter inside. The chamber 2 is provided with a supporter 2b that supports the workpiece W1, which is an irradiated target, so that the heating light H1 entering through the light-transmissive window 2a is irradiated onto the irradiated surface W1a of the workpiece W1.

The light-emitting element 11 in the present embodiment is a surface-mounted LED element with a square shape when viewed in the Z direction and has a size of 1 mm square (the term "mm square" refers to the length of one side of the square. The same is applied hereinafter.) The light-emitting element 11 typically has a wavelength of 365 nm to 405 nm.

The light-emitting element 11 may be, for example, an LED element having a size of 1.4 mm square or 2 mm square; it may also be an LED element having a rectangular shape when viewed in the Z direction. Furthermore, the light-emitting element 11 may be an LED element other than a surface-mounted type, or a light-emitting element other than an LED element, for example, an LD element, a fluorescent element, as long as it can be used for the heat treatment of the workpiece W1.

The light-emitting element substrate 12 is disposed on the main surface 13b of the cooling member 13, as shown in FIGS. 1A and 1B. In the present embodiment, one light-emitting element substrate 12 is disposed on one cooling member 13a.

The light-emitting element substrate 12 includes a light-emitting element area 11a where a plurality of the light-emitting elements 11 that are arranged in the X and Y directions on the mounting surface 12a thereof, as shown in FIG. 2. In the present embodiment, the light-emitting elements 11, which are arranged in the light-emitting element area 11a on the mounting surface 12a of the light-emitting element substrate 12, have a pitch of 2 mm in both the X and Y directions.

In order to achieve a high-power light source device for the heat treatment of the workpiece W1, the light-emitting elements 11 are necessary to be arranged in a narrow pitch and high density; specifically the light-emitting elements 11 are preferably to be arranged in a pitch of 3 mm or less.

The light-emitting element substrate 12 in the present embodiment employs a substrate made of aluminum nitride (AlN). The light-emitting element substrate 12 may also be made of materials other than aluminum nitride, for example, silicon carbide (SiC).

As shown in FIGS. 1B and 2, the cooling member 13a, which is a part of the cooling unit 13, includes an inlet port 13p from which the cooling medium C1 is supplied and an outlet port 13q from which the cooling medium C2 that has absorbed heat generated at the light-emitting elements 11 is discharged to the second main channel 15b. The cooling member 13a in the present embodiment is made of copper (Cu), which has high thermal conductivity and high heat resistance temperature. The cooling member 13a is machined to form a cooling channel 13r thereinside. Water is typically used as the cooling medium (C1, C2); however, other liquids such as fluorinated inert liquids (Fluorinert and Galden as their registered trademarks) can be used.

The cooling member 13a may also be made of materials other than copper, for example, aluminum, which has high thermal conductivity and high heat resistance temperature. A method of forming the cooling member 13a having the cooling channels 13r other than machining includes that of creating 3D image data of the cooling member 13a having the cooling channels 13r and forming it by 3D printing.

As shown in FIG. 1A, a plurality of the inlet ports 13p formed in the respective cooling members 13a are connected with a cooling mechanism 15 through the first main channel 15a, and a plurality of the outlet ports 13q formed in the respective cooling members 13a are connected with the cooling mechanism 15 through the second main channel 15b, which is different from the first main channel 15a. In other words, the cooling channels 13r provided in the respective cooling members 13a are connected in parallel between the first main channel 15a and the second main channel 15b.

Figure 4:
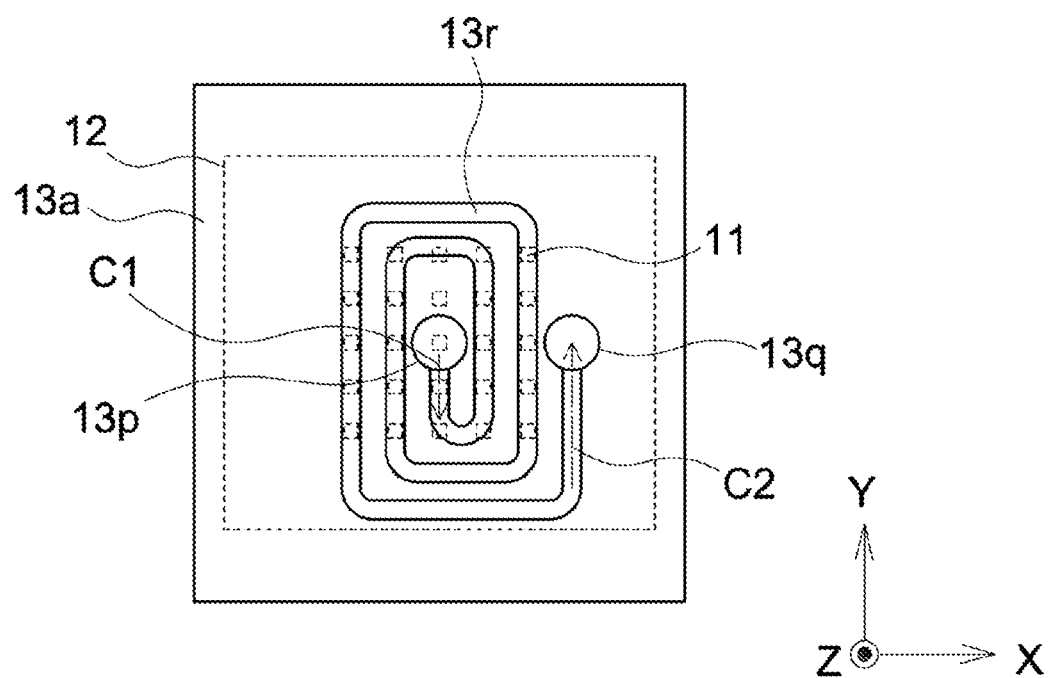
FIG. 4 is a cross-sectional view of the cooling member when viewed from the +Z side.
Figure 5A:
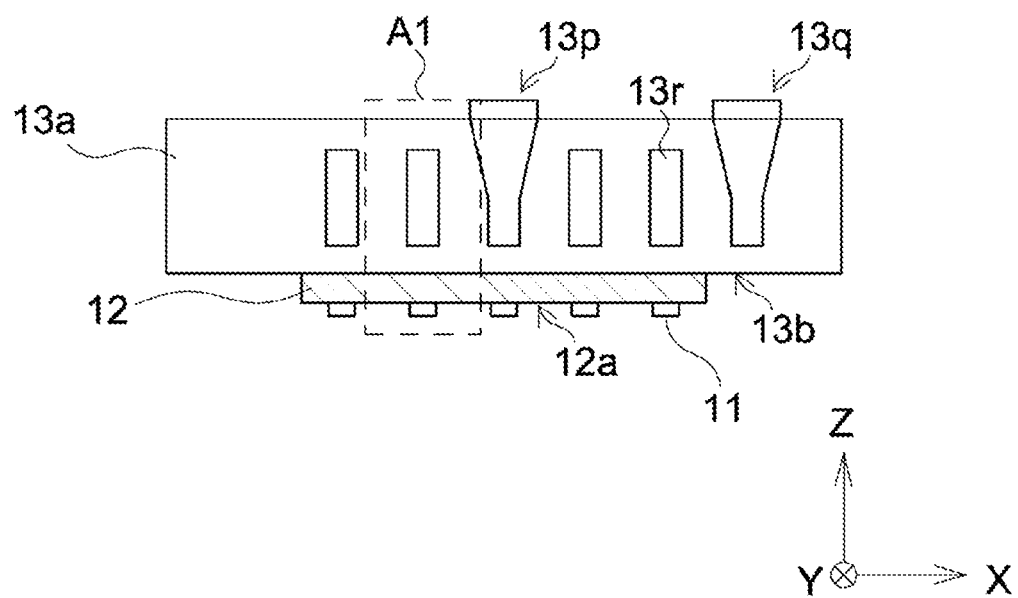
FIG. 5A is a cross-sectional view of the cooling member when viewed in the Y direction.
Figure 5B:
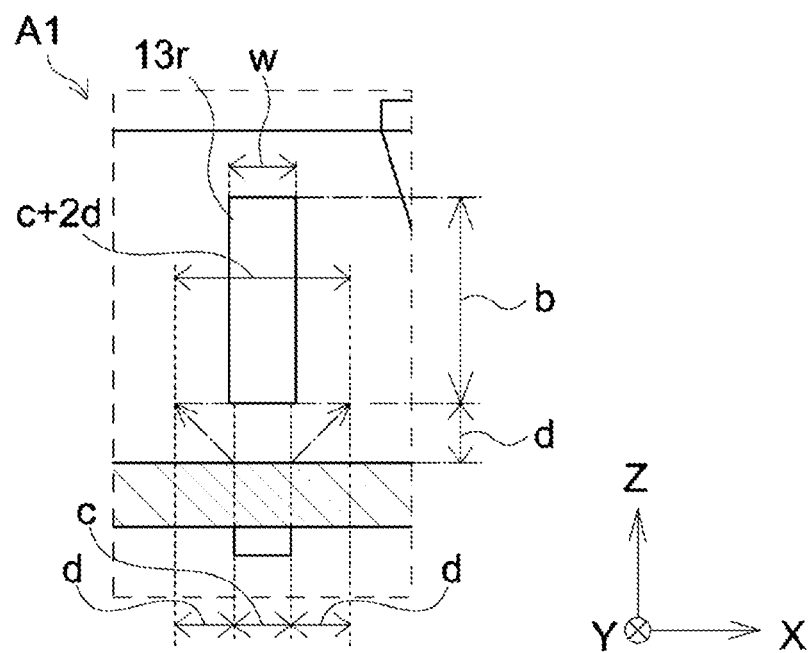
FIG. 5B is an enlarged view of the area A1 in FIG. 5A.

FIG. 4 is a cross-sectional view of the cooling member 13a when viewed from the +Z side. FIG. 5A is a cross-sectional view of the cooling member 13a when viewed in the Y direction, and FIG. 5B is an enlarged view of the area A1 in FIG. 5A. As shown in FIG. 4, the cooling member 13a is provided with the cooling channel 13r that communicates the inlet port 13p with the outlet port 13q and that the cooling medium C1 flows through.

As shown in FIG. 2, the cooling unit 13 of the present embodiment is divided into a plurality of the cooling members 13a and whose main surface 13b, on which the light-emitting element substrate 12 is mounted, has a rectangular shape; however, the cooling unit 13 may be divided into a plurality of the cooling members 13a having a shape other than a rectangular shape. The cooling member 13a, for example, may have the main surface 13b having a hexagonal shape, an octagonal shape, and a fan shape.

As shown in FIG. 4, the cooling channel 13r as a whole is formed to overlap the light-emitting element substrate 12 when viewed from the Z direction, and has a spiral shape being gradually from the center portion side of the light-emitting element area 11a (Refer to FIG. 2) to the circumferential edge portion side thereof, when viewed from the Z-direction.

The above configuration allows the cooling medium C1 to be branched from the main channel 15a and supplied to a plurality of the cooling units 13 through the respective cooling channels 13r in a state that heat has not yet been absorbed. The light-emitting element areas 11a (the light-emitting element substrate 12 in the present embodiment) are located in the vicinity of the respective cooling units 13. Thus, the respective light-emitting element areas 11a are cooled by the cooling medium C1, which has been sufficiently cool. Hence, this configuration suppresses the temperature variation in the entire cooling unit 13 and the temperature variation of the temperature distribution on the light-emitting element substrate 12, compared with the case in which the cooling medium C1 is supplied from one location of one long channel between the first main channel 15a and the second main channel 15b.

Therefore, the configuration suppresses the temperature variation of a plurality of the light-emitting elements 11 arranged on the light-emitting element substrate 12, resulting in suppressing the brightness variation of the light-emitting elements 11, thereby suppressing the uneven irradiation of the heating light H1 onto the workpiece W1.

In addition, in the above-mentioned viewpoint, the heating light source device 10 can include any number of the light-emitting element substrates as long as the heating light source device 10 is provided with a plurality of the light-emitting element areas 11a and heat generated at the respective light-emitting element areas 11a is structured to be cooled by the cooling medium C1 flowing through the cooling channels 13r that are arranged in parallel. In other words, the heating light source device 10 may include the single light-emitting element substrate 12 with a plurality of the light-emitting element areas 11a being formed thereon.

In addition, in the present embodiment, the cooling unit 13 is divided into a plurality of the cooling member 13a, and the light-emitting element substrate 12 is disposed on each of the cooling member 13a; however, for the similar reason, the number of the light-emitting element substrates 12 may be different from that of the cooling members 13a. For example, the single light-emitting element substrate 12 may be disposed on a plurality of the cooling members 13a in a manner to straddle the entire cooling members 13a.

In addition, in the present embodiment, one cooling member 13a is formed with one inlet port 13p, one outlet port 13q, and one cooling channel 13r; however, one cooling member 13a may be formed with a plurality of the inlet ports 13p, a plurality of the outlet ports 13q, and a plurality of the cooling channels 13r.

Moreover, the cooling unit 13 may not be divided into a plurality of the cooling members 13a. This will be described later with reference with FIG. 7.

Next, the cooling channel 13r will be discussed in detail including its preferable shape from the viewpoint of improving its cooling performance. FIG. 5A is a cross-sectional view of the cooling member 13a when viewed in the Y direction, and FIG. 5B is an enlarged view of the area A1 in FIG. 5A. The separation distance d between the main surface 13b on which the light-emitting element substrate 12 is mounted and the cooling channel 13r is set to 2 mm. When the separation distance d between the main surface 13b and the cooling channel 13r is larger, the thermal resistance is larger; when the separation distance d is smaller, the required fabrication technology is higher, increasing the cost. Hence, the separation distance d between the main surface 13b and the cooling channel 13r is preferably between 1 mm and 3 mm, and more preferably between 1.5 mm and 2.5 mm.

The channel width w of the cooling channel 13r in the present embodiment, shown in FIG. 5b, is set to 2 mm to satisfy the above equation (1). Here, the equation (1) is restated on the following.

$$1 \text{ mm} \leq w \leq c+2d \tag{1}$$

This light-emitting element 11 mounted on the heating light source device 10 in the present embodiment has a square shape when viewed in the Z direction; however, the light-emitting element 11 mounted thereon may have a rectangular shape when viewed in the Z direction. In this case, the value of c corresponds to the length of the longer side of the light-emitting element 11. When the light-emitting elements 11 having different sizes are mounted, the value of c is an average length of the longer sides of the respective light-emitting elements 11.

Here, under the specific condition, simulated calculation was conducted such that how the wall face temperature difference between the inner wall face of the cooling channel 13r and the cooling medium C1 varies with respect to the channel width w of the cooling channel 13r; the detail of the calculation is described below. It is noted that the result below is merely a theoretical calculation result conducted under the specific condition for the verification of designing the cooling channel 13r; thus it does not limit an available range of the channel width w of the cooling channel 13r in the present embodiment.

The parameters and values used in the calculations are listed in Table 1 below.

TABLE 1

| Parameter | Symbol | Value |
| --- | --- | --- |
| Channel cross-sectional area of cooling channel 13r | X | 12 mm² |
| Drive current per light-emitting element 11 | If | 1.4 A/unit |
| Applied voltage per light-emitting element 11 | Vf | 3.6 V/unit |
| Total number of light-emitting elements 11 | N | 240 pieces |
| Emission efficiency of light-emitting element 11 | η | 48.6% |
| Thermal conductivity of cooling medium C1 at 25 degree Celsius | k | 0.606384765 W/mK |
| Density of cooling medium C1 | ρ | 0.997044895 g/cm³ |
| Viscosity of cooling medium C1 | μ | 0.890438982 mPa · s |
| Flow velocity of cooling medium C1 | fv | 0.763888889 m/s |
| Kinematic viscosity of cooling medium C1 | v | 0.89307812 mm²/s |
| Thermal diffusivity of cooling medium C1 | α | 0.145399007 mm²/s |

The wall face temperature difference $\Delta T$ [K] is determined by the following equation (2):

$$\Delta T = P/(h \times S) \tag{2}$$

where P [W] is an amount of heat generation, h [W/m²K] is a heat transfer coefficient, and S [m²] is a channel surface area of the cooling channel 13r.

The channel surface area S of the cooling channel 13r according to the above equation (2) is determined by the following equation (3):

$$S = 2 \times (w+b) \times L \tag{3}$$

where w is a channel width of the cooling channel 13r, b is a depth thereof, and L is a channel length thereof. It is noted that the depth b is a parameter that varies with the channel width w to satisfy the value of the channel cross-sectional area X described in the above Table 1. The channel length L is a parameter that corresponds to the length of the cooling channel 13r that can be formed with the channel width w within a range of directly under (+Z side) the light-emitting element area 11a when the separation distance between the adjacent cooling channels is assumed to be equal to the channel width w.

The amount of heat generation P according to the above equation (2) is determined by the following equation (4):

$$P = If \times Vf \times N \times (1-\eta) \tag{4}$$

where If is a drive current per light-emitting element 11, Vf is an applied voltage per light-emitting element 11 and N is a total number of the light-emitting elements 11 and η is an emission efficiency of the light-emitting elements 11.

The heat transfer coefficient h according to the above equation (2) is determined by the following equation (5):

$$h = (k \times Nu)/de \quad (5)$$

where k is a thermal conductivity of the cooling medium C1, Nu is the Nusselt number and de is an equivalent diameter of the cross section of the cooling channel 13r.

The equivalent diameter de of the cross section of the cooling channel 13r according to the above equation (5) is determined by the following equation (6):

$$de = 4 \times X/Y \quad (6)$$

where X is a channel cross-sectional area of the cooling channel 13r and Y (=2×(w+b)) is a total peripheral length of the cross section of the cooling channel 13r.

The Nusselt number Nu according to the above equation (5) is determined by the following equation (7) called the Gnielinski equation:

$$Nu = \frac{(f/2)(Re - 1000)Pr}{1 + 12.7\sqrt{f/2}\left(Pr^{2/3} - 1\right)} \quad (7)$$

where f is a friction loss factor, Re is the Reynolds number, Pr is the Prandtl number.

The Reynolds number Re according to the above equation (7) is determined by the following equation (8):

$$Re = (\rho \times fv \times de)/\mu \quad (8)$$

where ρ is a density of the cooling medium C1, fv is a flow velocity thereof, and de is the equivalent diameter of the cooling channel 13r determined by the above equation (6).

The Prandtl number Pr according to the above equation (7) is determined by the following equation (9):

$$Pr = \upsilon/\alpha \quad (9)$$

where υ is a kinetic viscosity of the cooling medium C1 and α is a thermal diffusivity thereof.

The friction loss factor f according to the above equation (7) is determined by the following equation (10) called the Blasius equation using the Reynolds number calculated with the above equation (8).

$$f = 0.079 \times Re^{-25} \quad (10)$$

Figure 6:
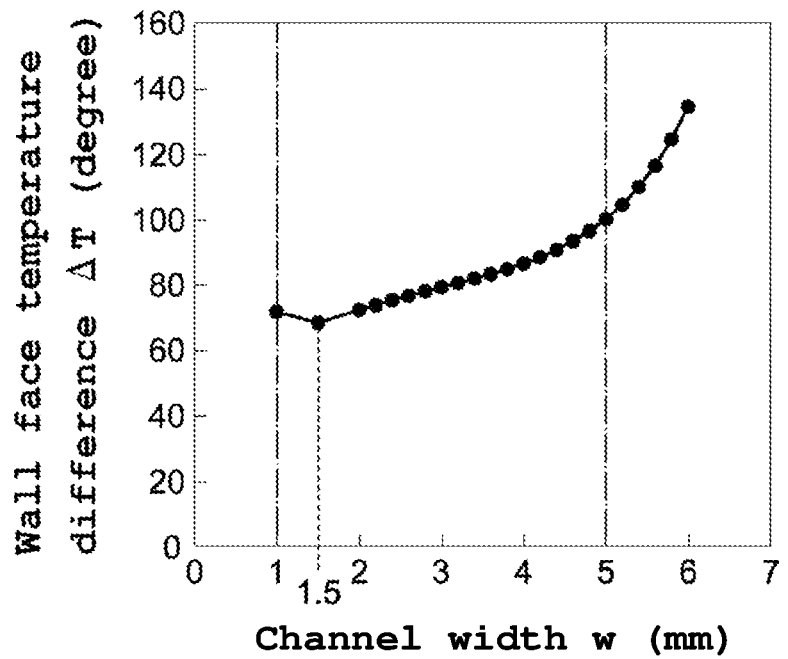
FIG. 6 is a graph illustrating a correlation between the wall face temperature difference and the channel width of a cooling channel.

FIG. 6 is a graph illustrating a correlation between the wall face temperature difference ΔT and the channel width w of the cooling channel 13r, which are determined by the above equations (2) to (10). As shown in FIG. 6, the graph has a small slope when the channel width w of the cooling channel 13r is 5 mm or less; however, the graph tends to have a larger slope when the channel width w exceeds 5 mm.

In addition, when the channel width w is 1.5 mm or less, the Nusselt number Nu decreases sharply, thus the wall face temperature difference tends to increase with decreasing the channel width w, as shown in FIG. 6.

As stated above, although the theoretical values are calculated under the above specified conditions, the channel width w of the cooling channel 13r is preferably 1 mm or more since there exists a change point (w=1.5) as shown in FIG. 6 and the wall face temperature difference is preferably configured to be small from the viewpoint of exhaust heat efficiency.

Furthermore, as described above, the process of forming the cooling channel 13r in the cooling unit 13 requires higher precision processing technology when the channel width w of the cooling channel 13r is narrower. Given these considerations and the results of the calculations under the conditions described above, the channel width w of the cooling channel 13r is preferably 1 mm or more and 5 mm or less as a guide.

Another Embodiment

Hereinafter, another embodiment will be described.

Figure 7:
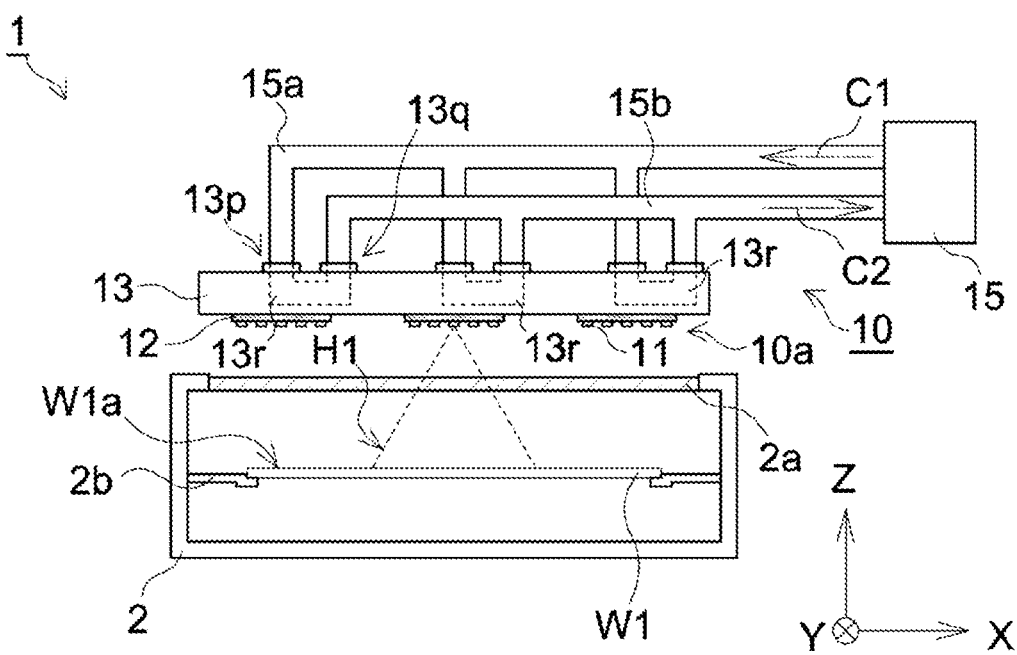
FIG. 7 is a schematic cross-sectional view illustrating an optical heating system provided with a heating light source device of another embodiment when viewed in the Y direction.
Figure 8:
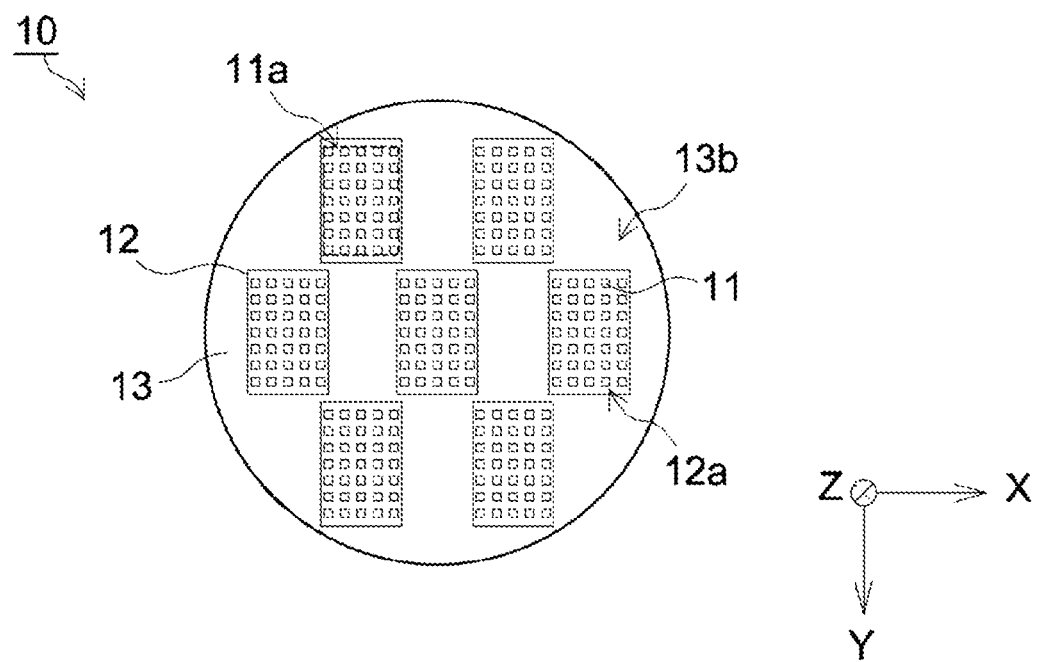
FIG. 8 is a drawing of the heating light source device in FIG. 7 when viewed from the −Z side.
Figure 9:
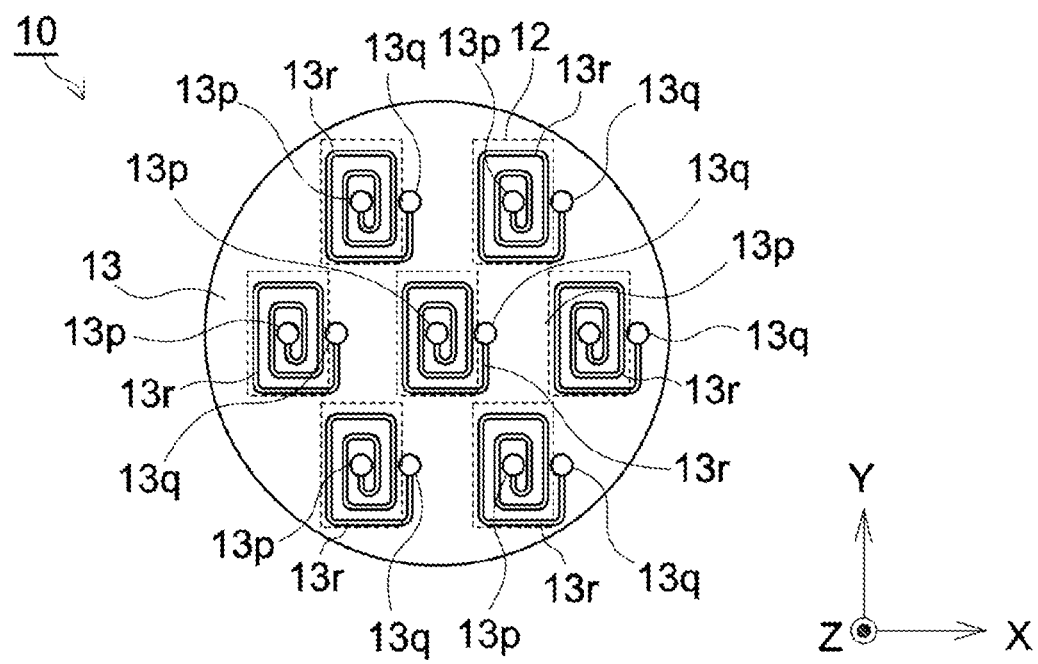
FIG. 9 is a drawing of the heating light source device in FIG. 7 when viewed from the +Z side.

<1> FIG. 7 is a schematic cross-sectional view illustrating an optical heating system 1 provided with a heating light source device 10 of another embodiment when viewed in the Y direction. FIG. 8 is a drawing of the heating light source device 10 in FIG. 7 when viewed from the −Z side. FIG. 9 is a drawing of the heating light source device 10 in FIG. 7 when viewed from the +Z side. As shown in FIGS. 7 and 8, the heating light source device 10 of the present embodiment is provided with the single cooling unit 13, which is unlike the cooling unit 13 having a plurality of the cooling members 13a in FIG. 2. The cooling unit 13 is provided with a plurality of the light-emitting element substrates 12 on the main surface 13b thereof.

As shown in FIG. 9, the cooling unit 13 is formed with a plurality of the inlet ports 13p, a plurality of the outlet ports 13q, and a plurality of the cooling channels 13r, each of the cooling channels 13r communicates between the respective pair of the inlet port 13p and the outlet port 13q. As shown in FIG. 7, each of the inlet ports 13p is connected with the first main channel 15a, and each of the outlet ports 13q is connected with the second main channel 15b. In other words, each of the cooling channels 13r is connected in parallel between the first main channel 15a and the second main channel 15b.

As shown in FIG. 7, the above configuration eliminates the need for the base 14, thus reducing the number of the components of the entire heating light source device 10, thereby enabling a simple configuration.

As shown in FIG. 9, the cooling channel 13r formed with the cooling unit 13 may be formed in a manner to overlap a part of the light-emitting element substrate 12, and not to overlap the entire light-emitting element substrate 12 when viewed from the Z direction. In addition, FIG. 9 shows that the number of the light-emitting element areas 11a (here, the light-emitting element substrates 12) is the same number of the cooling channels 13r; however, the number of the light-emitting element areas 11a (light-emitting element substrates 12) may be different from that of the cooling channels 13r since the present embodiment does not strictly require that the number of light-emitting element areas 11a (light-emitting element substrates 12) be exactly the same as the number of cooling channels 13r.

In addition, in the above embodiment, the cooling channel 13r has a spiral shape being gradually from a center portion side of the light-emitting element area 11a to the circumferential edge portion side thereof when viewed from the Z direction; however, the cooling channel 13r can have any shape and may be appropriately adjusted in accordance with a shape of the light-emitting element area 11a and an arrangement pattern of the light-emitting elements 11 when viewed from the Z direction.

Figure 10:
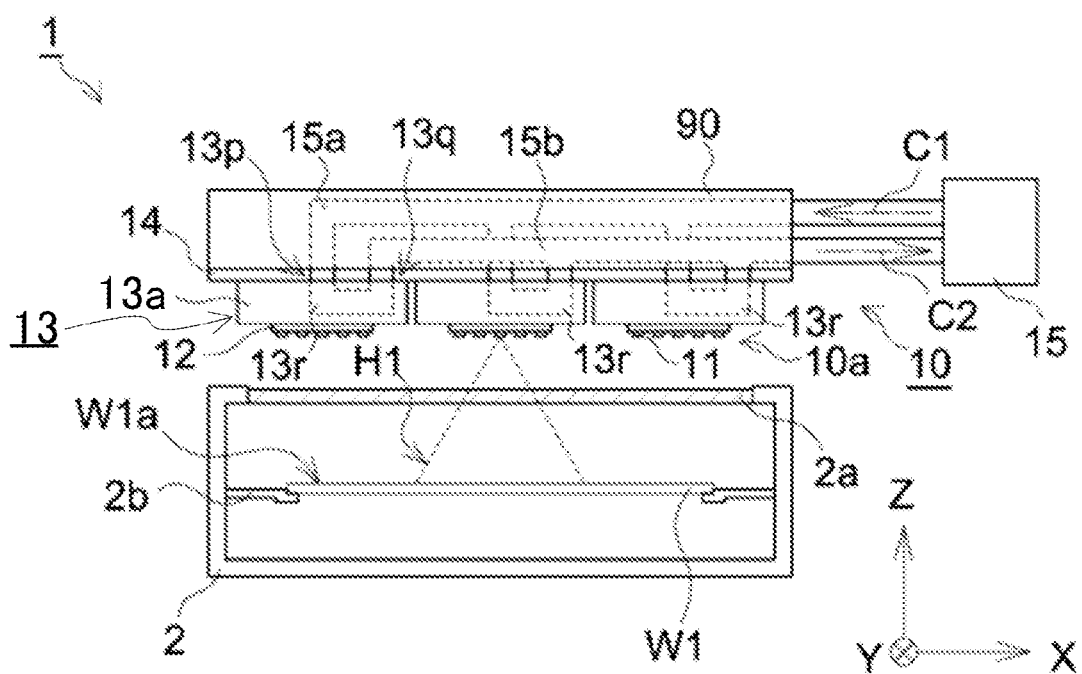
FIG. 10 is a schematic cross-sectional view illustrating an optical heating system provided with a heating light source device of yet another embodiment when viewed in the Y direction.

<2> FIG. 10 is a schematic cross-sectional view illustrating an optical heating system 1, which is different from that shown in FIG. 7, provided with a heating light source device 10 of yet another embodiment when viewed in the Y direction. The heating light source device 10 of the present embodiment, as shown in FIG. 10, includes a water distribution plate 90 inside which the first main channel 15a and the second main channel 15b are formed.

The above configuration eliminates the need for a space for piping, thus allows the first main channel 15a and the second main channel 15b to be configured in a vicinity of the cooling unit 13 with a minimum space, thereby enabling the entire system to be compact.

The water distribution plate 90 can be made of, for example, cupper or aluminum. The first main channel 15a or the second main channel 15b are formed by machining the water distribution plate 90. A method of forming the water distribution plate 90 having the first main channel 15a and the second main channel 15b other than machining includes that of creating 3D image data of the water distribution plate 90 having the first main channel 15a and the second main channel 15b and forming it by 3D printing.

Moreover, the cooling unit 13 and the water distribution plate 90 may be integrally configured. In other words, the heating light source device 10 of the present invention may be provided with the cooling unit 13 in which a plurality of the cooling channels 13r are formed in parallel between the first main channel 15a and the second main channel 15b instead of the water distribution plate 90 being additionally provided.

<3> The configurations of the above heating light source device 10 are merely examples; the present invention is not limited to each of the configurations shown in the drawings.

What is claimed is:

1. A heating light source device comprising:
a light source section having a plurality of light-emitting element areas that contain a plurality of light-emitting elements, each of the light-emitting element areas being separated from each other;
a cooling unit disposed in contact with the light source section, the cooling unit having a main surface on which the light source section is mounted;
a plurality of cooling channels formed for each of the light-emitting element areas inside the cooling unit and each of the cooling channels having a pair of an inlet port and an outlet port, the cooling channels being independently disposed each other;
a water distribution plate integrally formed with the cooling unit and housing a first main channel and a second main channel,
the first main channel connected with one end of each of the cooling channels; and
the second main channel connected with the other end of each of the cooling channels,
wherein each of the cooling channels is formed at an internal position of the cooling unit corresponding to one of the light-emitting element areas.

2. The heating light source device according to claim 1, wherein the light source section includes a plurality of light-emitting element substrates that are divided by each of the light-emitting element areas, each light-emitting element substrate having a mounting surface on which the light-emitting elements are mounted and each light-emitting element substrate is configured to overlap with at least part of the cooling channel when viewed from a direction orthogonal to the mounting surface of the light-emitting element substrate.

3. The heating light source device according to claim 1, wherein the cooling channel has a spiral shape being gradually from a center portion side of the light-emitting element area to the circumferential edge portion side thereof when viewed from a direction orthogonal to the main surface of the cooling unit.

4. The heating light source device according to claim 2, wherein the cooling channel has a spiral shape being gradually from a center portion side of the light-emitting element area to the circumferential edge portion side thereof when viewed from a direction orthogonal to the main surface of the cooling unit.

5. The heating light source device according to claim 3, wherein the cooling channel has a channel width that is configured to satisfy the following formula (1) when viewed from a direction orthogonal to the main surface of the cooling unit:

$$1 \text{ mm} \leq w \leq c+2d \quad (1)$$

where w is the channel width, c is an average length of sides of the light-emitting elements, each of the one sides being defined as equal to or longer than the other side thereof; and d is a separation distance between the main surface of the cooling unit and the cooling channel with respect to the direction orthogonal to the main surface of the cooling unit.

6. The heating light source device according to claim 4, wherein the cooling channel has a channel width that is configured to satisfy the following formula (1) when viewed from a direction orthogonal to the main surface of the cooling unit:

$$1 \text{ mm} \leq w \leq c+2d \quad (1)$$

where w is the channel width, c is an average length of sides of the light-emitting elements, each of the one sides being defined as equal to or longer than the other side thereof; and d is a separation distance between the main surface of the cooling unit and the cooling channel with respect to the direction orthogonal to the main surface of the cooling unit.

7. The heating light source device according to claim 1, wherein the cooling unit is divided into a plurality of cooling members when viewed from a direction orthogonal to the main surface of the cooling unit, and each of the cooling members has the cooling channel formed thereinside.

8. The heating light source device according to claim 2, wherein the cooling unit is divided into a plurality of cooling members when viewed from a direction orthogonal to the main surface of the cooling unit, and each of the cooling members has the cooling channel formed thereinside.

* * * * *